US009847347B1

(12) United States Patent
Smith et al.

(10) Patent No.: US 9,847,347 B1
(45) Date of Patent: Dec. 19, 2017

(54) SEMICONDUCTOR STRUCTURE INCLUDING A FIRST TRANSISTOR AT A SEMICONDUCTOR-ON-INSULATOR REGION AND A SECOND TRANSISTOR AT A BULK REGION AND METHOD FOR THE FORMATION THEREOF

(71) Applicant: GLOBALFOUNDRIES Inc., Grand Cayman (KY)

(72) Inventors: Elliot John Smith, Dresden (DE); Nilesh Kenkare, Dresden (DE); Nigel Chan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/344,856

(22) Filed: Nov. 7, 2016

(51) Int. Cl.
  *H01L 27/12* (2006.01)
  *H01L 29/51* (2006.01)
  *H01L 29/45* (2006.01)
  *H01L 29/417* (2006.01)
  *H01L 29/66* (2006.01)
  *H01L 21/84* (2006.01)
  *H01L 21/311* (2006.01)

(52) U.S. Cl.
  CPC .... *H01L 27/1203* (2013.01); *H01L 21/31144* (2013.01); *H01L 21/84* (2013.01); *H01L 29/41783* (2013.01); *H01L 29/45* (2013.01); *H01L 29/51* (2013.01); *H01L 29/66545* (2013.01)

(58) Field of Classification Search
  CPC .......... H01L 27/1203; H01L 21/31144; H01L 21/84; H01L 29/41783; H01L 29/45; H01L 29/51; H01L 29/66545
  See application file for complete search history.

(56) References Cited

U.S. PATENT DOCUMENTS

| 6,033,963 | A  | 3/2000  | Huang et al. |
|-----------|----|---------|--------------|
| 7,871,915 | B2 | 1/2011  | Lim et al. |
| 8,963,208 | B2 | 2/2015  | Flachowsky et al. |
| 9,514,942 | B1 | 12/2016 | Smith et al. |
| 2005/0051854 | A1 | 3/2005 | Cabral, Jr. et al. |
| 2005/0153530 | A1 | 7/2005 | Ku et al. |
| 2005/0272191 | A1 | 12/2005 | Shah et al. |
| 2006/0022277 | A1 | 2/2006 | Kavalieros et al. |

(Continued)

*Primary Examiner* — Karen Kusumakar
(74) *Attorney, Agent, or Firm* — Amerson Law Firm, PLLC (57) ABSTRACT

A semiconductor structure includes a substrate, a first transistor and a second transistor. The substrate includes a semiconductor-on-insulator region and a bulk region. The first transistor is provided at the semiconductor-on-insulator region and includes a first gate structure and a first channel region provided in a layer of semiconductor material over a layer of electrically insulating material. The second transistor is provided at the bulk region and includes a second gate structure and a second channel region provided in a bulk semiconductor material. A plane of an interface between the second channel region and the second gate structure is not above a plane of an interface between the bulk semiconductor material and the layer of electrically insulating material in the semiconductor-on-insulator region. A height of the second gate structure is greater than a height of the first gate structure.

20 Claims, 10 Drawing Sheets

(56) References Cited

U.S. PATENT DOCUMENTS

2010/0032761 A1* 2/2010 Ding ................ H01L 21/82346
                                                    257/350
2011/0215409 A1   9/2011 Li et al.

* cited by examiner

SEMICONDUCTOR STRUCTURE INCLUDING A FIRST TRANSISTOR AT A SEMICONDUCTOR-ON-INSULATOR REGION AND A SECOND TRANSISTOR AT A BULK REGION AND METHOD FOR THE FORMATION THEREOF

BACKGROUND

1. Field of the Disclosure

Generally, the present disclosure relates to the field of integrated circuits, and, more particularly, to integrated circuits wherein semiconductor-on-insulator techniques are employed.

2. Description of the Related Art

Integrated circuits typically include a large number of integrated circuits, such as field effect transistors. Field effect transistors include a gate structure provided over a channel region, wherein the channel region is provided in a semiconductor material between a source region and a drain region that are doped differently than the channel region.

For improving the performance of integrated circuits including field effect transistors, it has been proposed to employ semiconductor-on-insulator technology. In semiconductor-on-insulator technology, a semiconductor-on-insulator substrate may be provided. The semiconductor-on-insulator substrate includes a thin layer of semiconductor material, for example, silicon, that is provided above a bulk semiconductor material, for example, silicon. The layer of semiconductor material is separated from the bulk semiconductor material by a layer of an electrically insulating material, for example, silicon dioxide. Source, drain and channel regions of field effect transistors may be provided in the layer of semiconductor material. Compared to integrated circuits wherein the source, channel and drain regions of field effect transistors are formed in a bulk semiconductor material, semiconductor-on-insulator technology may allow reducing parasitic capacitances and leakage currents. Moreover, integrated circuits formed in accordance with semiconductor-on-insulator technology may be less sensitive with respect to ionizing radiation.

However, semiconductor-on-insulator technology may have some issues associated therewith, which include the so-called "floating body effect." The body of a field effect transistor forms a capacitor with the bulk semiconductor material therebelow. In this capacitor, electric charge may accumulate and cause adverse effects, which may include a dependence of the threshold voltage of the field effect transistor on its previous states.

For substantially avoiding the floating body effect, it has been proposed to use fully depleted field effect transistors. Fully depleted field effect transistors are formed using a semiconductor-on-insulator substrate wherein the semiconductor layer provided on the electrically insulating layer has a smaller thickness than a channel depletion width of the field effect transistor. Thus, the electric charge and, accordingly, the body potential of the field effect transistor are fixed.

However, fully depleted field effect transistors may be less suitable for some applications so that it may be desirable to form fully depleted field effect transistors and bulk field effect transistors on a same substrate.

U.S. Pat. No. 8,963,208 discloses removing portions of a semiconductor layer and a dielectric layer from a part of a semiconductor-on-insulator substrate so that a bulk semiconductor material is exposed and performing a selective growth process for depositing a semiconductor material on the bulk semiconductor material, wherein a semiconductor region having a surface that is substantially planar with a surface of a layer of semiconductor material is formed. Thereafter, transistors may be formed both in a portion of the semiconductor-on-insulator substrate wherein the dielectric layer and the semiconductor layer were not removed and on the semiconductor region formed by the selective growth process. However, a selective growth process may significantly contribute to the costs of the manufacturing process.

In view of the situation described above, the present disclosure provides a semiconductor structure and a method for the formation thereof, wherein a selective growth process for forming a bulk semiconductor region having a surface that is substantially planar with a surface of the semiconductor layer of a semiconductor-on-insulator region need not be performed.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a substrate, a first transistor and a second transistor. The substrate includes a semiconductor-on-insulator region and a bulk region. The first transistor is provided at the semiconductor-on-insulator region and includes a first gate structure and a first channel region. The first channel region is provided in a layer of semiconductor material over a layer of electrically insulating material. The second transistor is provided at the bulk region and includes a second gate structure and a second channel region. The second channel region is provided in a bulk semiconductor material. A plane of an interface between the second channel region and the second gate structure is not above a plane of an interface between the bulk semiconductor material and the layer of electrically insulating material in the semiconductor-on-insulator region. A height of the second gate structure is greater than a height of the first gate structure.

An illustrative method disclosed herein includes providing a substrate including a semiconductor-on-insulator region having a first semiconductor surface and a bulk region having a second semiconductor surface. A plane of the second semiconductor surface is below a plane of the first semiconductor surface. A first dummy gate structure is formed on the first semiconductor surface and a second dummy gate structure is formed on the second semiconductor surface. A dielectric layer is deposited over the first and second dummy gate structures. A polishing process is performed. The polishing process planarizes the dielectric layer and the first and second dummy gate structures. A replacement gate process is performed wherein a gate structure of a first transistor is formed on the basis of the first dummy gate structure and a gate structure of a second transistor is formed on the basis of the second dummy gate structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Figure 1:
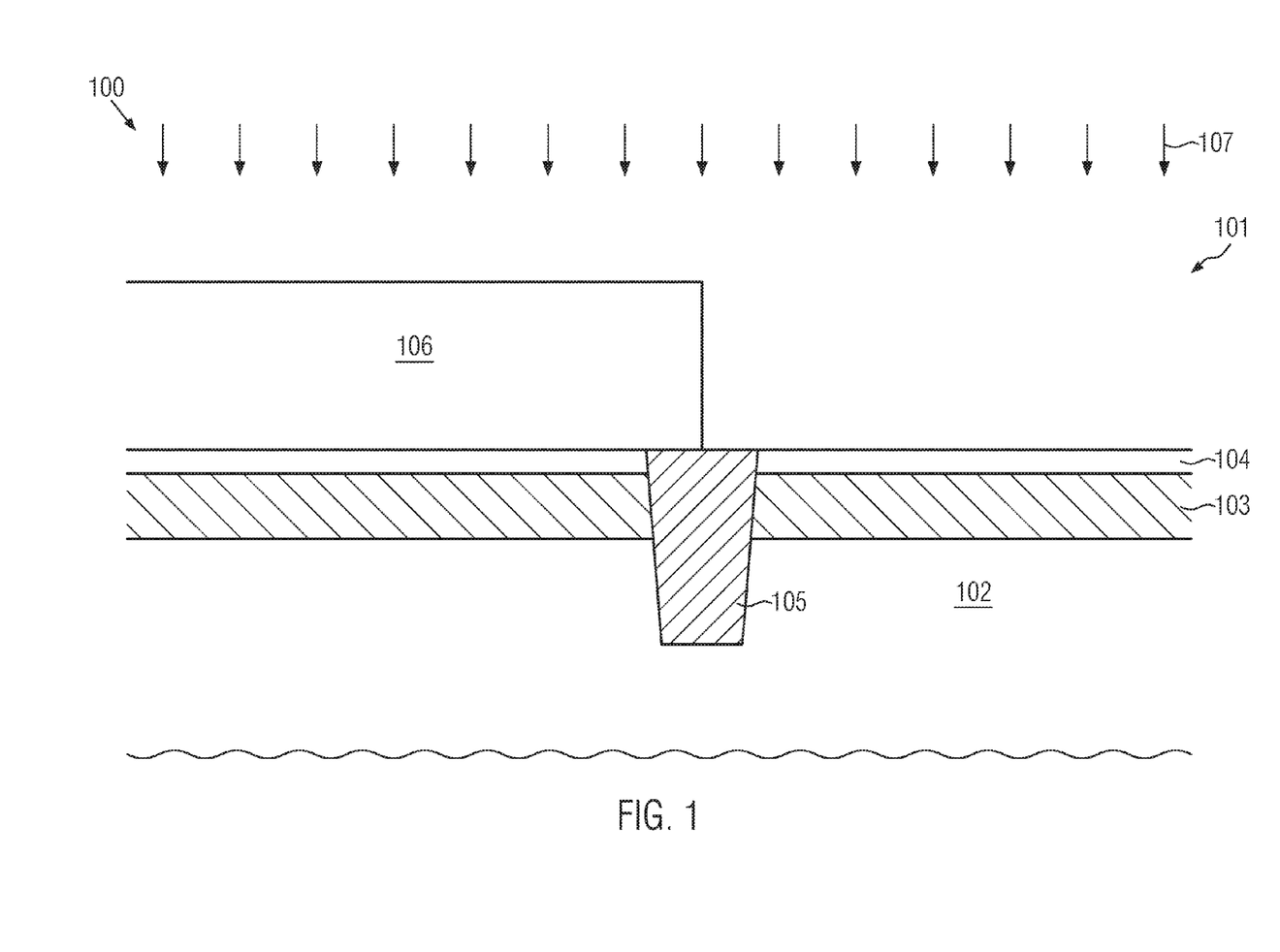
FIGS. 1-10 show schematic cross-sectional views of a semiconductor structure according to an embodiment in stages of a method of manufacturing a semiconductor structure according to an embodiment.

FIG. 1 shows a schematic cross-sectional view of a semiconductor structure 100 at a stage of a method of manufacturing a semiconductor structure according to an embodiment. The semiconductor structure 100 may include a semiconductor-on-insulator wafer 101. The semiconductor-on-insulator wafer 101 may include a bulk semiconductor wafer 102 including a bulk semiconductor material such as, for example, silicon. On the bulk semiconductor wafer 102, a layer 103 of an electrically insulating material, for example, a silicon dioxide layer, and a layer 104 of a semiconductor material, for example, a silicon or silicon germanium layer, may be provided. The semiconductor-on-insulator wafer 101 may be formed by means of known techniques for the formation of semiconductor-on-insulator wafers, which may include a formation of the layer 103 of electrically insulating material on the surface of a sacrificial wafer, bonding the sacrificial wafer having the layer 103 of electrically insulating material formed thereon to the bulk semiconductor wafer 102 and cleaving the sacrificial wafer, wherein a portion of the sacrificial wafer remains on the layer 103 of electrically insulating material and provides the layer 104 of semiconductor material. In some embodiments, the semiconductor-on-insulator wafer 101 may be a fully depleted semiconductor-on-insulator wafer, wherein the layer 103 of electrically insulating material has a thickness in a range from about 5-30 nm and the layer 104 of semiconductor material has a thickness in a range from about 5-25 nm.

The semiconductor structure 100 may further include a trench isolation structure 105 including one or more trenches extending through the layer 104 of semiconductor material and the layer 103 of electrically insulating material into the bulk semiconductor wafer 102 and being filled with an electrically insulating material such as, for example, silicon dioxide. The trench isolation structure 105 may be formed using known techniques for the formation of trench isolation structures including photolithography, etching, oxidation, deposition and/or chemical mechanical polishing.

After the formation of the trench isolation structure 105, a mask 106 may be formed over the semiconductor structure 100. The mask 106 covers portions of the semiconductor structure 100 at which a semiconductor-on-insulator region 207 (see FIG. 2) is to be provided and does not cover portions of the semiconductor structure at which a bulk region 208 (see FIG. 2) is to be provided. The mask 106 may be a photoresist mask, and it may be formed by means of photolithography.

After the formation of the mask 106, one or more etch processes 107 adapted to remove the materials of the layer 104 of semiconductor material and the layer 103 of electrically insulating material may be performed. The one or more etch processes 107 may include dry and/or wet etch processes for removing silicon and silicon dioxide.

Figure 2:
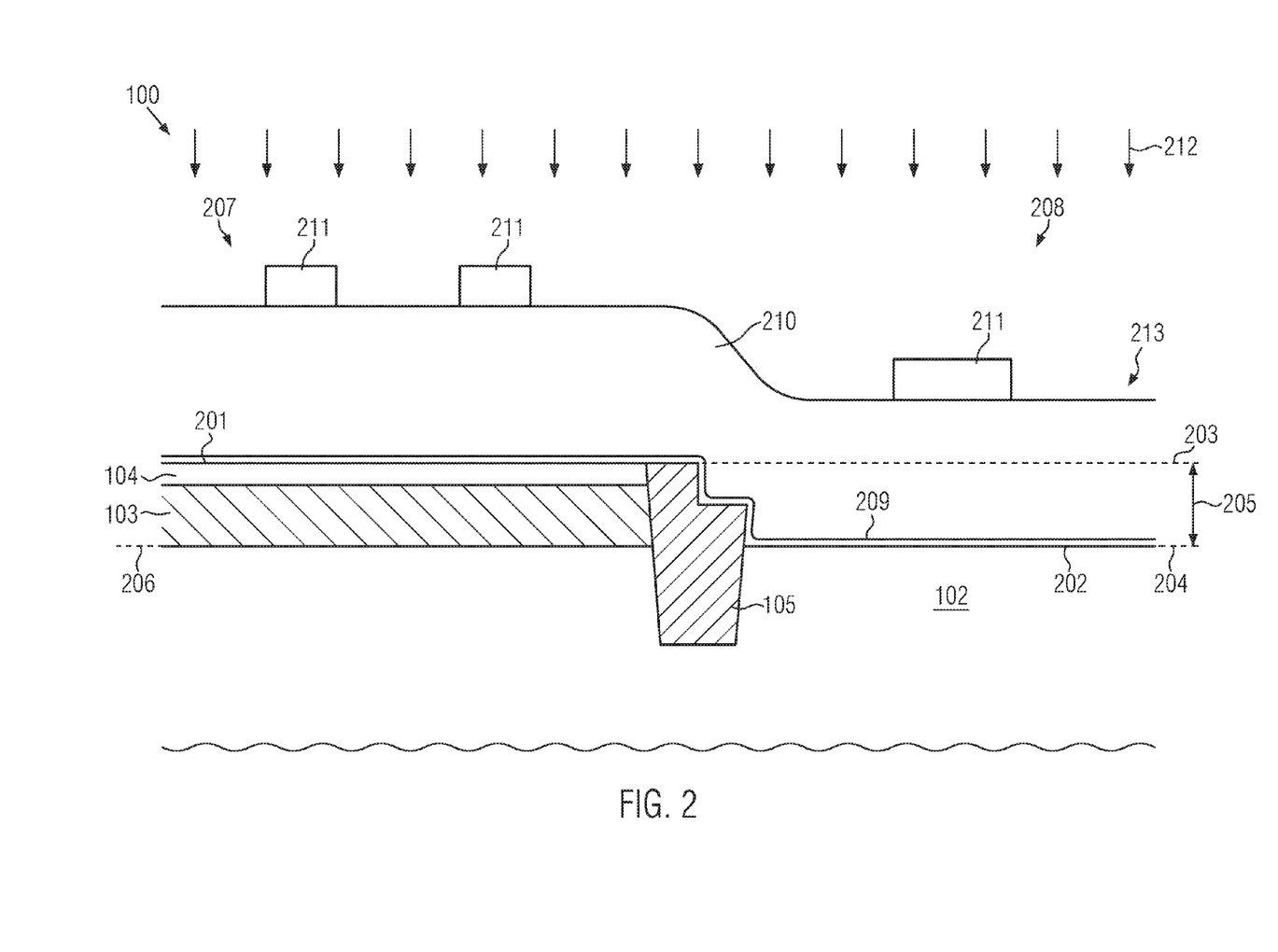

FIG. 2 shows a schematic cross-sectional view of the semiconductor structure 100 at a later stage of the method. The one or more etch processes 107 may remove portions of the layer 104 of semiconductor material and the layer 103 of electrically insulating material which are not covered by the mask 106 so that a portion of the bulk semiconductor wafer 102 is exposed. Thus, a bulk semiconductor region 208 having a semiconductor surface 202 provided by a surface of the bulk semiconductor wafer 102 may be formed. Portions of the layer 104 of semiconductor material and the layer 103 of electrically insulating material which are covered by the mask 106 during the one or more etch processes 107 may remain in the semiconductor structure 100 and provide a semiconductor-on-insulator region 207 having a semiconductor surface 201 that is provided by a surface of the layer 104 of semiconductor material.

After the one or more etch processes 107, the mask 106 may be removed, for example, by means of a photoresist strip process.

In FIG. 2, reference numeral 203 denotes a plane of the semiconductor surface 201 of the semiconductor-on-insulator region 207. The semiconductor surface 201 is lying substantially in the plane 203, apart from small deviations of the semiconductor surface 201 from an ideal shape.

Reference numeral 204 denotes a plane of the semiconductor surface 202 of the bulk region 208. The semiconductor surface 202 may lie substantially in the plane 204, apart from some small deviations of the semiconductor surface 202 from its ideal shape.

Reference numeral 206 denotes a plane of an interface between the bulk semiconductor material of the bulk semiconductor wafer 102 and the layer 103 of electrically insulating material in the semiconductor-on-insulator region 207. The interface between the bulk semiconductor material and the layer 103 of electrically insulating material may lie substantially in the plane 206, apart from some small deviations of the interface from its ideal shape.

The plane 204 of the semiconductor surface 202 of the bulk region 208 may be below the plane 203 of the semiconductor surface 201 of the semiconductor-on-insulator region 207. In some embodiments, the plane 204 of the semiconductor surface 202 of the bulk region 208 may substantially correspond to the plane 206 of the interface between the bulk semiconductor material and the layer 103 of electrically insulating material. In such embodiments, a step height 205 between the plane 203 of the semiconductor surface 201 of the semiconductor-on-insulator region 207 and the plane 204 of the semiconductor surface 202 of the bulk region 208 may be approximately equal to a sum of the thicknesses of the layer 103 of electrically insulating material and the layer 104 of the semiconductor material. In other embodiments, the one or more etch processes 107 may remove an amount of the bulk semiconductor material of the bulk semiconductor wafer 102 after the removal of the layer 104 of semiconductor material and the layer 103 of electrically insulating material. Thus, the plane 204 of the semiconductor surface of the bulk region 208 may be below the plane 206 of the interface between the bulk semiconductor material and the layer 103 of electrically insulating material in the semiconductor-on-insulator region 207, and the step height 205 may be greater than the sum of the thicknesses of the layer 103 of electrically insulating material and the layer 104 of semiconductor material. Hence, in some embodiments, the plane 204 of the semiconductor surface 202 of the bulk region 208 is not above the plane 206 of the interface between the bulk semiconductor material of the bulk semiconductor wafer 102 and the layer 103 of electrically insulating material in the semiconductor-on-insulator region 207. The step height 205 may be in a range from about 10-30 nm.

The one or more etch processes 107 may remove an amount of material from portions of the trench isolation structure 105 which are not covered by the mask 106 so that a stepped surface of the trench isolation structure 105 may be obtained, as schematically illustrated in FIG. 2.

After the formation of the semiconductor-on-insulator region 207 and the bulk region 208, a dummy gate stack 213 may be deposited over the semiconductor structure 100. The dummy gate stack 213 may include a dummy gate insulation layer 209 and a dummy gate electrode layer 210. A total thickness of the dummy gate stack 213, corresponding to a sum of the thicknesses of the dummy gate insulation layer 209 and the dummy gate electrode layer 210, may be in a range from about 70-90 nm.

In some embodiments, the dummy gate insulation layer 209 may include silicon dioxide and the dummy gate electrode layer 210 may include amorphous silicon and/or polysilicon. In some embodiments, the dummy gate insulation layer 209 may include a high-k material having a dielectric constant greater than silicon dioxide, for example, a material having a dielectric constant (k) value of at least 10, hafnium dioxide, zirconium dioxide, hafnium silicate and/or hafnium zirconium oxide, in addition to a thin buffer layer which may include silicon dioxide. In such embodiments, a layer of a work function adjustment metal such as, for example, titanium nitride, tantalum nitride, aluminum and/or lanthanum may be provided between the dummy gate insulation layer 209 and the dummy gate electrode layer 210.

A masking layer e.g., a hardmask 211 may be formed over the dummy gate electrode layer 210. The hardmask 211 may include silicon nitride and/or silicon dioxide and it may be formed by depositing a layer of a material of the hardmask 211, for example, a silicon nitride layer, and patterning the layer of the material of the hardmask 211 by means of techniques of photolithography and etching. The hardmask 211 may be provided at locations where gate structures 801, 802, 803 of transistors 713, 714, 715 (see FIG. 8) are to be formed.

After the removal of the portions of the layer 104 of semiconductor material and the layer 103 of electrically insulating material from the bulk region 208, and before the formation of the dummy gate stack 213 and the hardmask 211, no selective epitaxial growth process for growing semiconductor material at the bulk region 208 needs to be performed, and the bulk semiconductor material at the bulk region 208 may be provided by the semiconductor material of the bulk semiconductor wafer 102.

After the formation of the hardmask 211, one or more etch processes 212 for selectively removing the materials of the dummy gate electrode layer 210 and the dummy gate insulation layer 209 may be performed.

Figure 3:
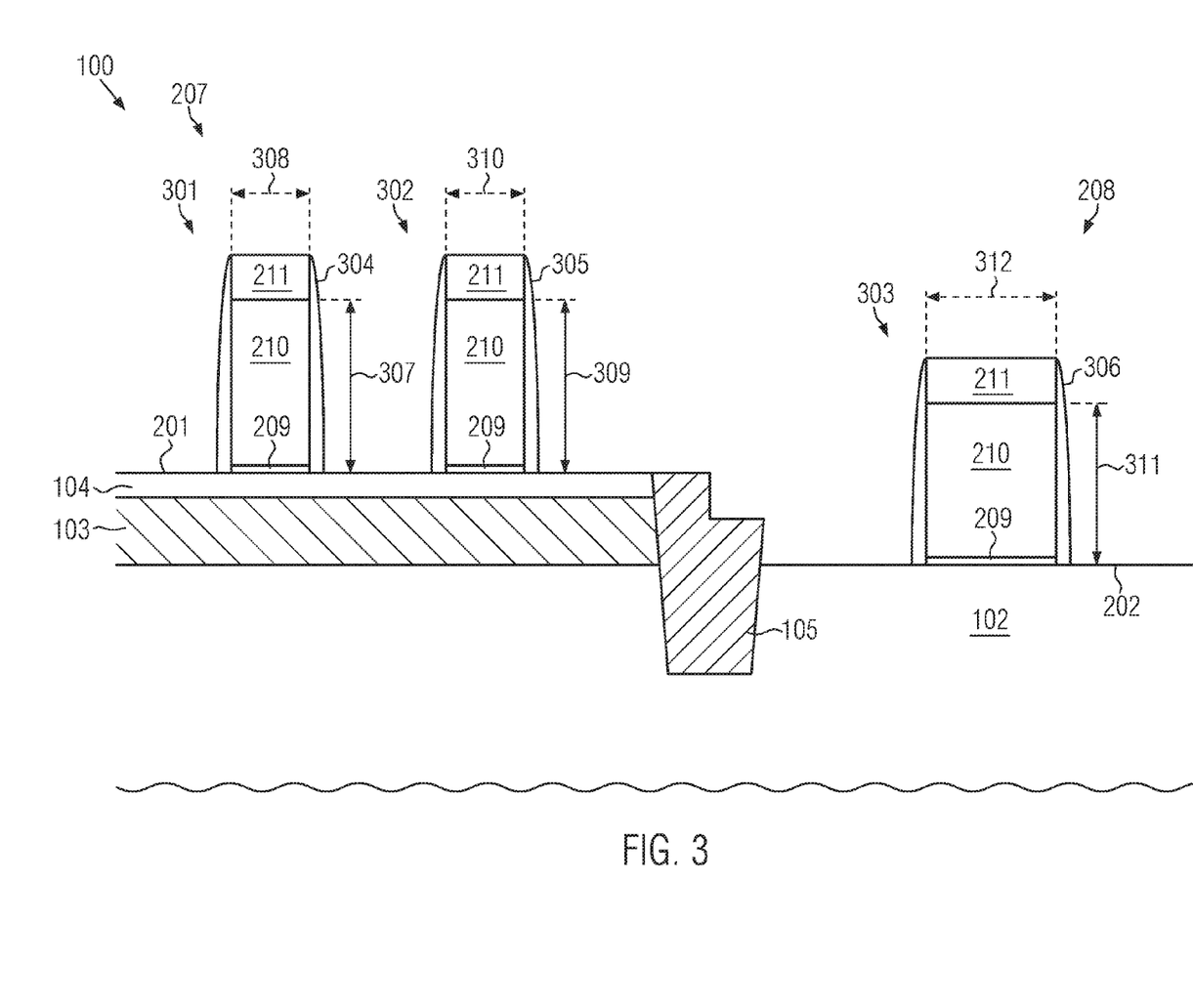

FIG. 3 shows a schematic cross-sectional view of the semiconductor structure 100 at a later stage of the method. The one or more etch processes 212 may remove portions of the dummy gate stack 213 that are not covered by the hardmask 211. Thus, dummy gate structures 301, 302, 303 may be formed. Each of the dummy gate structures 301, 302, 303 may include portions of the dummy gate electrode layer 210 and the dummy gate insulation layer 209, and they may be covered by a portion of the mask 211 providing a cap layer of the respective dummy gate structure.

Adjacent the dummy gate structures 301, 302, 303, sidewall spacers 304, 305, 306 may be formed. For forming the sidewall spacers 304, 305, 306, one or more layers of sidewall spacer material, for example, one or more layers including silicon dioxide, siliconborocarbonitride, silicon nitride and/or silicon oxynitride, may be substantially isotropically deposited over the semiconductor structure 100, and one or more anisotropic etch processes may be performed for removing portions of the one or more layers of sidewall spacer material on substantially horizontal portions of the semiconductor structure 100. Portions of the one or more layers of sidewall spacer material at the sidewalls of the dummy gate structures 301, 302, 303 may remain in the semiconductor structure 100, and may provide the sidewall spacers 304, 305, 306.

In FIG. 3, reference numeral 308 denotes an extension of the dummy gate structure 301 in a channel length direction of the transistor 713 (horizontal in the view of FIG. 3). Similarly, reference numerals 310, 312 denote extensions of the dummy gate structures 302, 303 in the channel length directions of the transistors 714 and 715, respectively. Reference numerals 307, 309, 311 denote heights of the dummy gate structures 301, 302, 303.

The heights 307, 309, 311 may be approximately equal to the thickness of the dummy gate stack 213, and may be in a range from about 70-90 nm. The extensions 308, 310 of the dummy gate structures 301, 302 at the semiconductor-on-insulator region 207 in the channel length directions of the transistors 713, 714 may be in a range from about 12-25 nm in accordance with the 12 nm technology node. An aspect ratio between the height 307 and the extension 308 in the channel length direction of the dummy gate structure 301 and an aspect ratio between the height 309 and the extension 310 in the channel length direction of the dummy gate structure 302 may be about 2.5 or more, for example, it may be in a range from about 3-7.

The extension 312 of the dummy gate structure 303 at the bulk region 208 in the channel length direction may be greater than the extensions 308, 310 of the dummy gate structures 301, 302 in the channel length direction. For example, the extension 312 of the dummy gate structure 303 in the channel length direction may be in a range from about 70 nm to about 10 μm.

Figure 4:
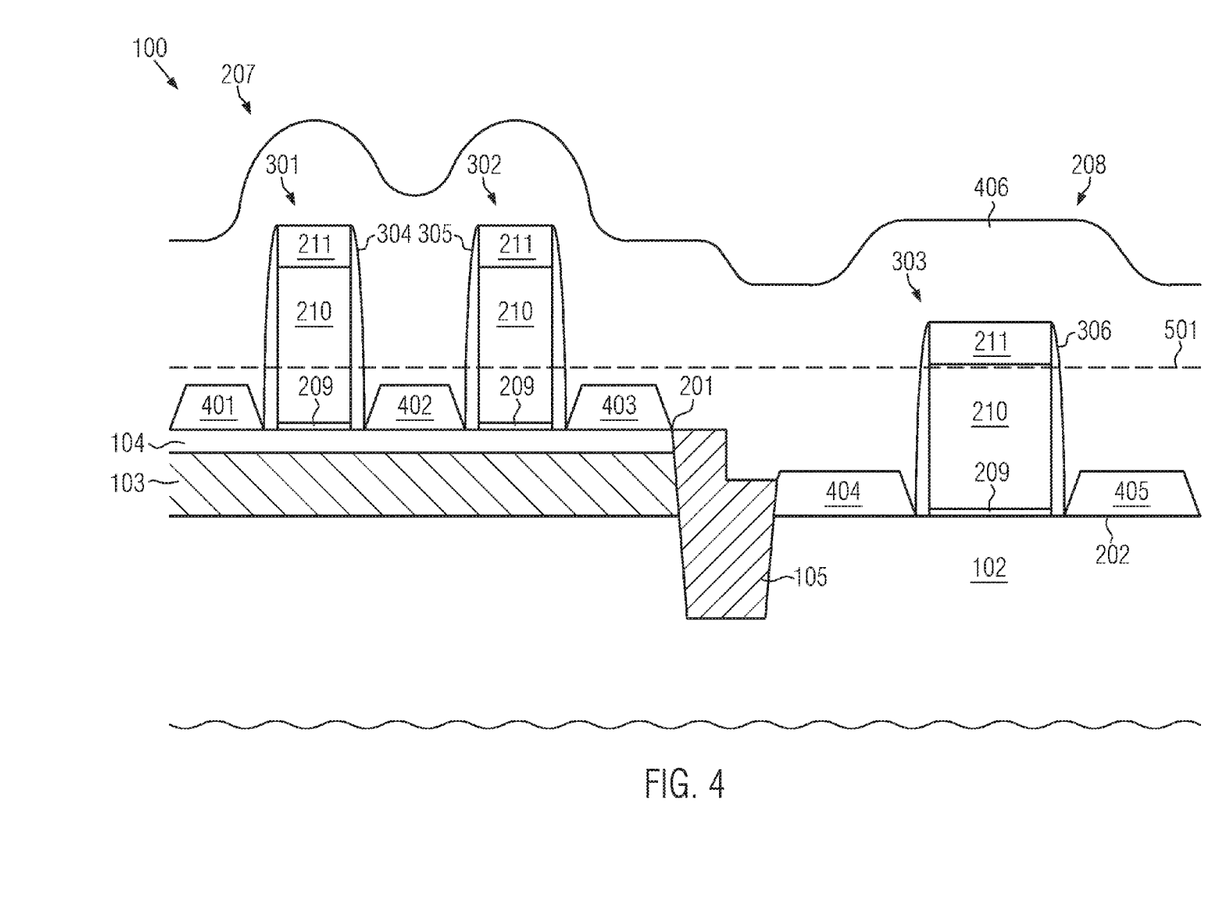

FIG. 4 shows a schematic cross-sectional view of the semiconductor structure 100 in a later stage of the method. After the formation of the dummy gate structures 301, 302, 303 and the sidewall spacers 304, 305, 306, a selective epitaxial growth process may be performed. The selective epitaxial growth process may deposit a semiconductor material, for example, silicon and/or silicon germanium, adjacent each of the dummy gate structures 301, 302, 303 so that raised source/drain regions 401, 402, 403, 404, 405 are formed. The selective epitaxial growth process may be a deposition process wherein deposition parameters are adapted such that semiconductor material is deposited substantially only on portions of the semiconductor structure 100 where the semiconductor materials of the layer 104 of semiconductor material and the bulk semiconductor wafer 102 are exposed at the surface of the semiconductor structure 100 and substantially no deposition of semiconductor material or only a deposition of a relatively small amount of semiconductor material is obtained at portions of the semiconductor structure 100 formed of other materials such as, for example, the trench isolation structure 105, the caps of the dummy gate structures 301, 302, 303 provided by the hardmask 211 and the sidewall spacers 304, 305, 306. The selective epitaxial growth process employed for the formation of the raised source/drain regions 401 to 405 may be adapted such that the deposited semiconductor material is in situ doped in accordance with the type of the transistors 713, 714, 715 (P-doped for P-channel transistors and N-doped for N-channel transistors). The raised source/drain region 401 may provide a raised source region of the transistor 713, the raised source/drain region 402 may provide a raised drain region of the transistor 713 and a raised source region of the transistor 714, and the raised source/drain region 403 may provide a raised drain region of the transistor 714. The raised source/drain region 404 may provide a raised source region of the transistor 715 and the raised source/drain region 405 may provide a raised drain region of the transistor 715.

After the formation of the raised source/drain regions 401 to 405, a dielectric layer 406 may be deposited over the semiconductor structure 100. The dielectric layer 406 may cover each of the dummy gate structures 301, 302, 303 and portions of the semiconductor structure 100 between the dummy gate structures 301, 302, 303, such as the raised source/drain regions 401 to 405 and the trench isolation structure 105. In some embodiments, the dielectric layer 406 may be a silicon dioxide layer and it may be formed by means of deposition techniques such as chemical vapor deposition and/or plasma enhanced chemical vapor deposition.

Figure 5:
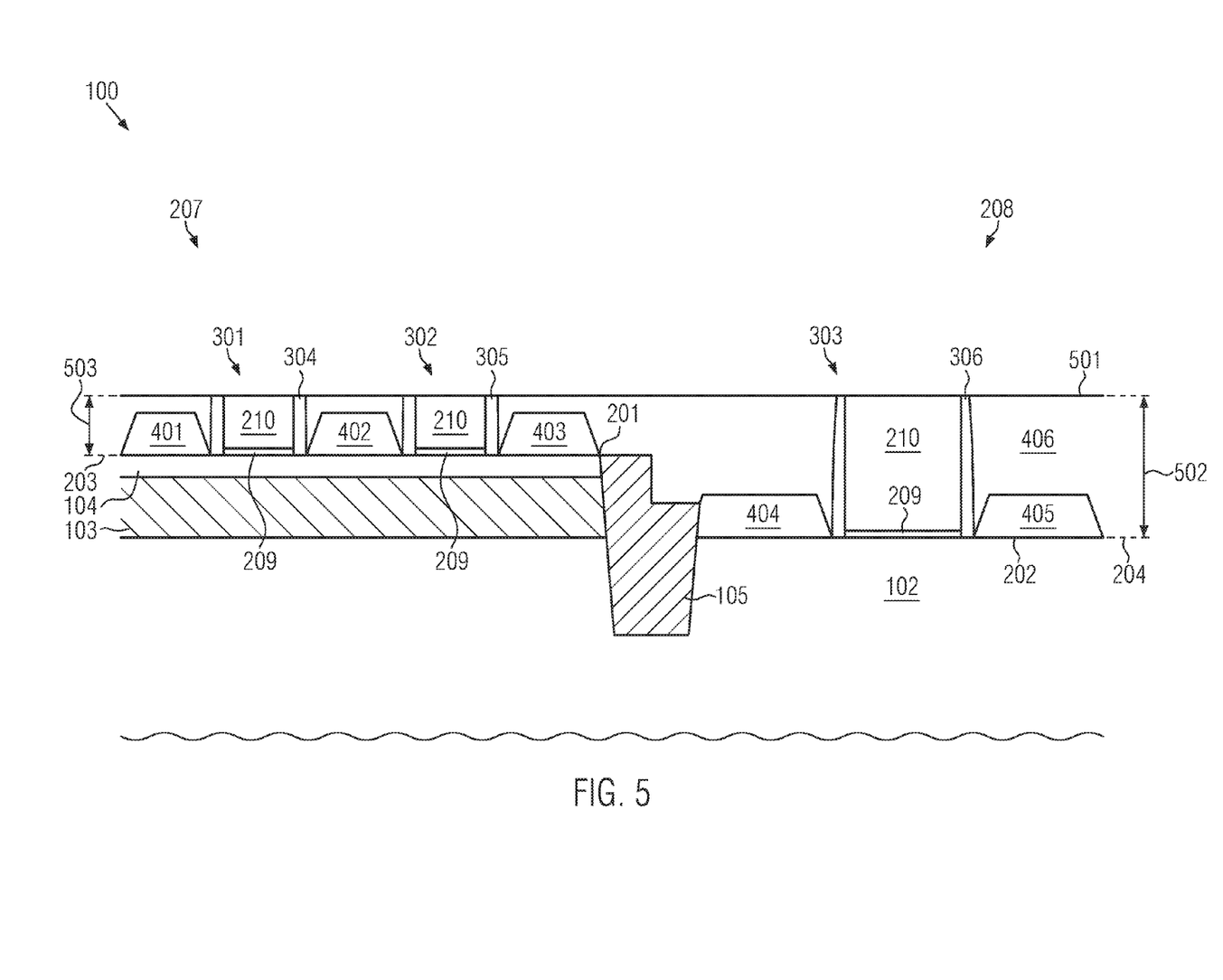

FIG. 5 shows a schematic cross-sectional view of the semiconductor structure 100 at a later stage of the method. After the deposition of the dielectric layer 406 over the dummy gate structures 301, 302, 303, a polishing process, for example, a chemical mechanical polishing process, may be performed. The polishing process may planarize the dielectric layer 406 and the dummy gate structures 301, 302, 303 so that a substantially planar polished surface 501 of the semiconductor structure 100 is obtained. In FIG. 4, the level of the polished surface 501 of the semiconductor structure 100 that is obtained after the polishing process is schematically illustrated by a dashed line. After the polishing process, substantially coplanar top surfaces of the dummy gate structures 301, 302, 303 may be obtained. As illustrated in FIG. 4, the polishing process may remove a relatively small portion of the dummy gate structure 303 below the cap of the dummy gate structure 303 provided by the hard mask 211. However, due to the step height between the planes of the semiconductor surfaces 201, 202, the polishing process may remove relatively large parts of the portions of the dummy gate electrode layer 210 in the dummy gate structures 301, 302 at the semiconductor-on-insulator region 207 so that a substantial reduction of the heights of the dummy gate structures 301, 302 at the semiconductor-on-insulator region 207 is obtained.

After the polishing process, the dummy gate structures 301, 302 may have a height 503 that is substantially equal to a distance between the polished surface 501 of the semiconductor structure 100 and the plane 203 of the semiconductor surface 201. The dummy gate structure 303 may have a height 502 that is substantially equal to a distance between the polished surface 501 of the semiconductor structure 100 and the plane 204 of the semiconductor surface 202.

In some embodiments, the height 503 of the dummy gate structure 301, 302 obtained after the polishing process may be about one-half or less of the heights 307, 309 of the dummy gate structures 301, 302 obtained directly after the formation of the dummy gate structures 301, 302, which substantially correspond to the thickness of the dummy gate stack 213. The height 502 of the dummy gate structure 303 may be about 75% or more of the height 311 of the dummy gate structure 303 that is obtained directly after the formation thereof.

Figure 6:
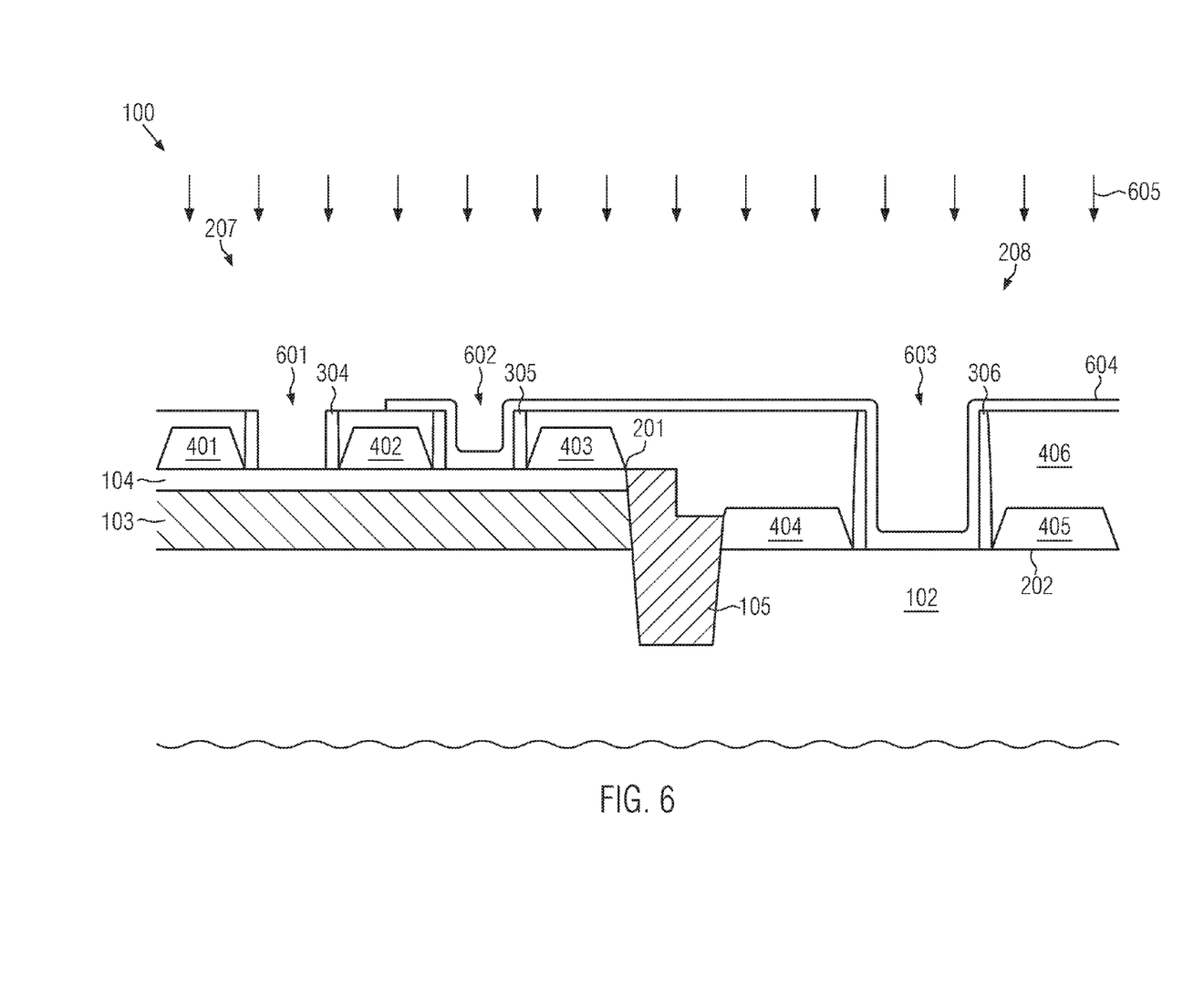

FIG. 6 shows a schematic cross-sectional view of the semiconductor structure 100 at a later stage of the method. After the polishing process, the dummy gate structures 301, 302, 303 may be removed. This may be done by means of one or more etch processes adapted to selectively remove the materials of the dummy gate electrode layer 210 and the dummy gate insulation layer 209 relative to the materials of the dielectric layer 406, the sidewall spacers 304, 305, 306, the layer 104 of semiconductor material and the bulk semiconductor wafer 102.

In some embodiments, only parts of the dummy gate structures 301, 302, 303 may be removed. For example, in embodiments wherein the dummy gate structures 301, 302, 303 include a dummy gate insulation layer including a high-k material and/or a work function adjustment metal layer, the dummy gate electrode layer 210 including amorphous silicon and/or polysilicon may be removed, and the dummy gate insulation layer and/or the work function adjustment metal layer may remain in the semiconductor structure 100.

The total or partial removal of the dummy gate structures 301, 302, 303 may form a recess 601 at the location of the dummy gate structure 301, a recess 602 at the location of the dummy gate structure 302 and a recess 603 at the location of the dummy gate structure 303.

In some embodiments, in particular in embodiments wherein the dummy gate structures 301, 302, 303 are completely removed, after the removal of the dummy gate structures 301, 302, 303, a hard mask 604 may be formed.

The hard mask 604 may be formed by depositing a layer of a hard mask material such as, for example, silicon dioxide and/or silicon nitride over the semiconductor structure 100 and patterning the layer of the hard mask material by means of techniques of photolithography and etching. The hard mask 604 may cover the recesses 602, 603 that were obtained by removing the dummy gate structures 302, 303, but not the recess 601 obtained by removing the dummy gate structure 301.

After the formation of the hard mask 604, a dry and/or wet etch process 605 adapted for removing the semiconductor material of the layer 104 of semiconductor material may be performed.

Figure 7:
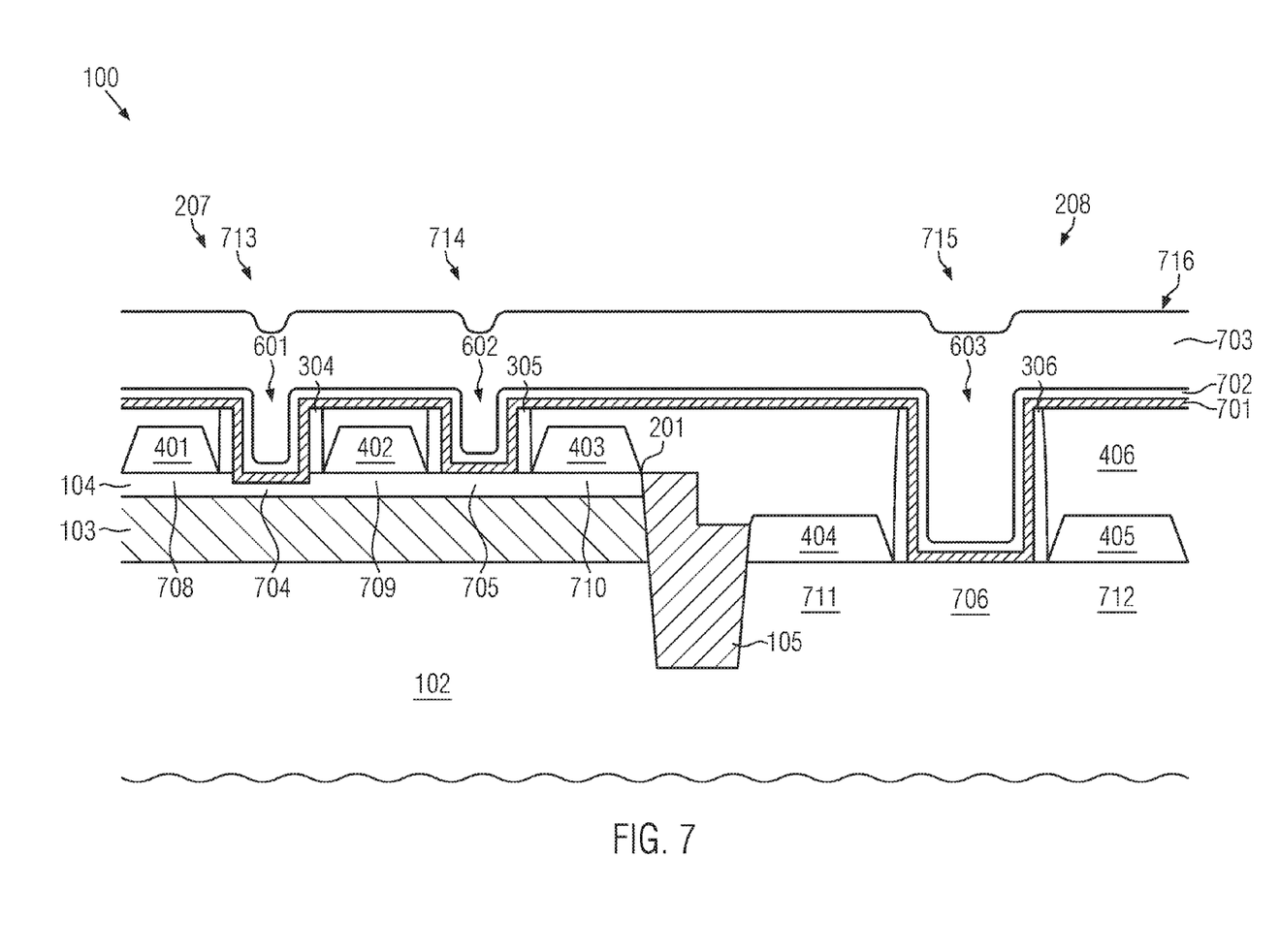

FIG. 7 shows a schematic cross-sectional view of the semiconductor structure 100 at a later stage of the method. The etch process 605 may remove a part of a portion 704 of the layer 104 of semiconductor material at the bottom of the recess 601 so that the portion 704 of the layer 104 of semiconductor material at the bottom of the recess 601 is thinned. A portion 705 of the layer 104 of semiconductor material at the bottom of the recess 602 and a portion 706 of the bulk semiconductor material at the bottom of the recess 603 may be protected from an etchant used in the etch process 605 by the hard mask 604 so that substantially no removal of material is obtained at the bottom of the recesses 602, 603.

The portions 704, 705 of the layer 104 of semiconductor material may provide channel regions of transistors 713, 714 provided at the semiconductor-on-insulator region 207. By removing material of the layer 104 of semiconductor material at the bottom of the recess 601, the channel region 704 of the transistor 713 may be thinned relative to the channel region 705 of the transistor 714, which may help to obtain an increased performance of the integrated circuit that is formed on the basis of the semiconductor structure 100.

After the etch process 605, the hard mask 604 may be removed by means of an etch process adapted to selectively remove the material of the hard mask 604.

In other embodiments, for example in embodiments wherein the dummy gate structures 301, 302, 303 are only partially removed, the formation of the mask 604 and the etch process 605 may be omitted so that no selective thinning of the channel region of the transistor 713 at the semiconductor-on-insulator region 207 is obtained.

A channel region 706 of a transistor 715 at the bulk region 208 may be provided in the semiconductor material of the bulk semiconductor wafer 102. Thus, the transistor 715 may have a bulk transistor configuration, whereas the transistors 713, 714 at the semiconductor-on-insulator region 207 have a semiconductor-on-insulator transistor configuration.

After the removal of the dummy gate structures 301, 302, 303 and, optionally, the thinning of the portion 704 of the layer 104 of semiconductor material wherein the channel of the transistor 713 is provided, a gate stack 716 may be deposited over the semiconductor structure 100. The gate stack 716 may include a gate insulation layer 701, a work function adjustment metal layer 702 and a gate electrode material layer 703. The gate insulation layer 701 may include a high-k material having a greater dielectric constant than silicon dioxide, for example, hafnium dioxide, zirconium dioxide, hafnium silicate and/or hafnium zirconium oxide, and, optionally, a thin buffer layer formed of silicon dioxide. The work function adjustment metal layer 702 may include a metal adapted for adjusting a work function of the gate electrodes of the transistors 713, 714, 715 in accordance with the type of the transistors 713, 714, 715 (N-channel or P-channel). For example, the work function adjustment metal layer 702 may include titanium nitride, tantalum nitride, aluminum and/or lanthanum. The gate electrode material layer 703 may include amorphous silicon and/or polysilicon. For depositing the gate insulation layer 701, the work function adjustment metal layer 702 and the gate electrode material layer 703, known deposition processes for depositing the materials of the layers 701, 702, 703 may be used, for example, atomic layer deposition, physical vapor deposition, chemical vapor deposition and/or plasma enhanced chemical vapor deposition.

In embodiments wherein the gate structures 301, 302, 303 are only partially removed, the deposition of the gate insulation layer 701 and the work function adjustment metal layer 702 may be omitted, and the gate stack 716 may be provided by the gate electrode material layer 703.

After the formation of the gate stack 716, an annealing process may be performed. In the annealing process, dopants in the raised source/drain regions 401 to 405 may be activated. Additionally, dopants from the raised source/drain regions 401 to 405 may diffuse into portions of the layer 104 of semiconductor material and the bulk semiconductor material of the bulk semiconductor wafer 102, respectively, therebelow. Thus, source/drain regions 708, 709, 710 may be obtained in the layer 104 of semiconductor material, and source/drain regions 711, 712 may be obtained in the bulk semiconductor material. The source/drain region 708 may provide a source region of the transistor 713, the source/drain region 709 may provide a drain region of the transistor 713 and a source region of the transistor 714 and the source/drain region 710 may provide a drain region of the transistor 714. The source/drain region 711 may provide a source region of the transistor 715 and the source/drain region 712 may provide a drain region of the transistor 715.

Figure 8:
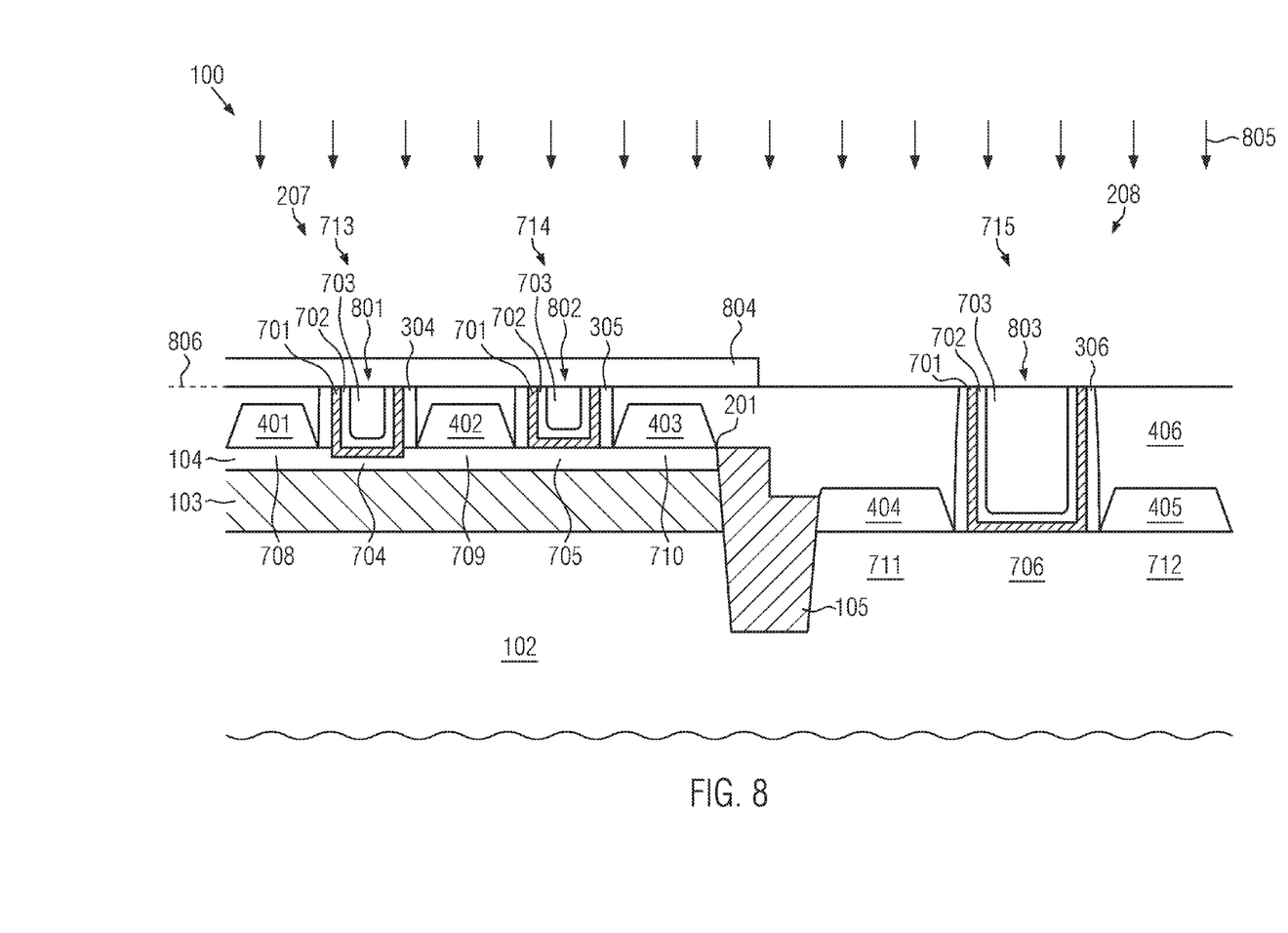

FIG. 8 shows a schematic cross-sectional view of the semiconductor structure 100 at a later stage of the method. After the deposition of the gate stack 716, a polishing process, for example a chemical mechanical polishing process, may be performed for removing portions of the gate stack 716 outside the recesses 601, 602, 603. Portions of the gate stack 716 in the recesses 601, 602, 603 may remain in the semiconductor structure 100, and may provide gate structures 801, 802, 803 of the transistors 713, 714, 715. Heights of the gate structures 801, 802, 803 may be approximately equal to the heights of the dummy gate structures 301, 302, 303. In particular, the heights of the gate structures 801, 802 may be approximately equal to or slightly smaller than (due to a loss of material of the dielectric layer 406 by the polishing of the gate stack 716) the height of the dummy gate structures 301, 302 and the height of the gate structure 803 may be approximately equal to or slightly smaller than the height of the dummy gate structure 303. Thus, the height of the gate structure 803 may be greater than the heights of the gate structures 801, 802. In some embodiments, the gate structures 801, 802 may have a height in a range from about 20-30 nm and the gate structure 803 may have a height in a range from about 45-60 nm.

The plane of an interface between the gate structure 802 and the channel region 704 may substantially correspond to the plane 203 of the semiconductor surface 201 and the plane of the interface between the gate structure 803 and the channel region 706 may substantially correspond to the plane 204 of the semiconductor surface 202.

Top surfaces of the gate structures 801, 802, 803 may be substantially coplanar in a plane 806 of the surface of the semiconductor structure 100 that is obtained after the polishing process wherein portions of the gate stack 716 outside the recesses 601, 602, 603 are removed.

After the polishing process, a mask 804 may be formed over the semiconductor structure 100. The mask 804 may be a hard mask and it may be formed by depositing a layer of a hard mask material such as silicon nitride over the semiconductor structure 100 and removing portions of the layer of hard mask material over the bulk region 208 so that the mask 804 covers the semiconductor-on-insulator region 207 but not the bulk region 208.

Thereafter, an etch process 805 adapted to selectively remove the material of the dielectric layer 406 may be performed. The etch process 805 may be a dry or wet etch process adapted to remove silicon dioxide.

Figure 9:
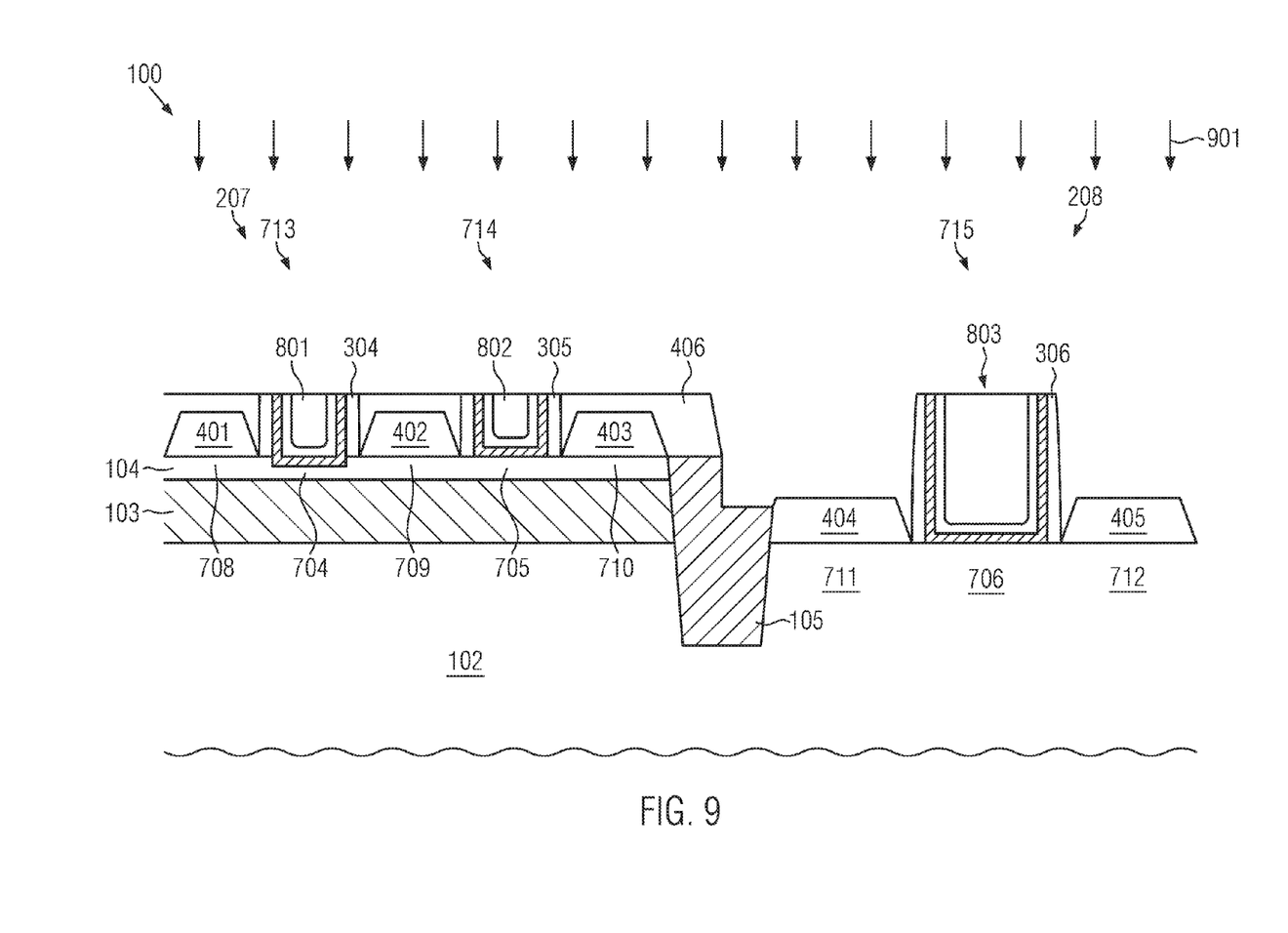

FIG. 9 shows a schematic cross-sectional view of the semiconductor structure 100 at a later stage of the method. The etch process 805 may remove a portion of the dielectric layer 406 over the bulk region 208 so that the raised source/drain regions 404, 405 are exposed at the surface of the semiconductor structure 100. Thereafter, the mask 804 may be removed by means of an etch process, which may be a wet or dry etch process adapted for selectively removing the material of the mask 804. Thereafter, an etch process 901 adapted to selectively remove the material of the dielectric layer 406 may be performed. The etch process 901 may remove portions of the dielectric layer 406 from the semiconductor-on-insulator region 207 so that the raised source/drain regions 401, 402, 403 are exposed at the surface of the semiconductor structure 100. Features of the etch process 901 may correspond to features of the etch process 805, wherein, however, the duration of the etch process 901 may be shorter than the duration of the etch process 805, since the portions of the dielectric layer 406 over the raised source/drain regions 401, 402, 403 in the semiconductor-on-insulator region 207 have a smaller thickness than portions of the dielectric layer 406 over the raised source/drain regions 404, 405 in the bulk region 208.

Figure 10:
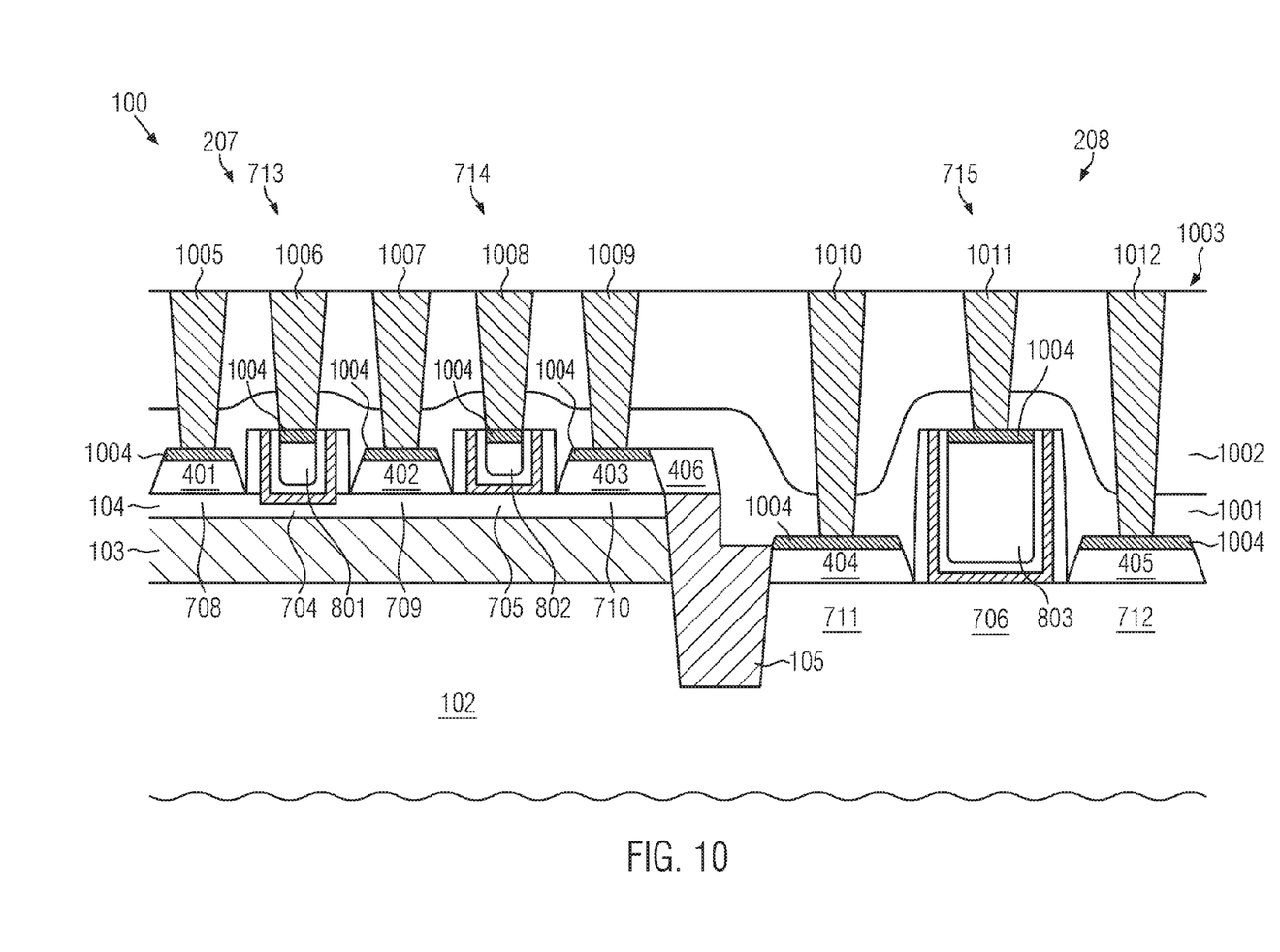

FIG. 10 shows a schematic cross-sectional view of the semiconductor structure 100 at a later stage of the method. In some embodiments, residues of the dielectric layer 406 over the trench isolation structure 105 may remain at the surface of the semiconductor structure 100, as schematically shown in FIG. 10.

After the etch process 901, a silicide 1004 may be formed in each of the raised source/drain regions 401 to 405 and the gate structures 801, 802, 803. For this purpose, a metal layer may be deposited over the semiconductor structure 100, and an annealing process may be performed to initiate a chemical reaction between the metal and the silicon in the raised source/drain regions 401 to 405 and the gate structures 801 to 803. Thereafter, unreacted metal may be removed by means of an etch process. Thereafter, a layer 1003 of one or more dielectric materials may be deposited over the semiconductor structure 100. In some embodiments, the layer 1003 of one or more dielectric materials may include a layer 1001 of a first dielectric material, for example, silicon nitride, having a compressive or tensile intrinsic stress for creating a stress in the channel regions 704, 705, 706 of the transistors 713, 714, 715. In embodiments wherein the transistors 713, 714, 715 are P-channel transistors, the stress provided by the layer 1001 may be compressive, and in embodiments wherein the transistors 713, 714, 715 are N-channel transistors, the stress provided by the layer 1001 may be tensile. Thus, a mobility of charge carriers in the channel regions 704, 705, 706 may be improved. Additionally, the layer 1003 of one or more dielectric materials may include an interlayer dielectric 1002, for example, tetraethyl orthosilicate and/or silicon dioxide. After the formation of the layer 1003 of one or more dielectric materials, a polishing process may be performed and contact holes 1005 to 1012 filled with an electrically conductive material such as, for example, tungsten may be formed for providing electrical connections to the raised source/drain regions 401 to 405 and the gate structures 801, 802, 803. This may be done by means of known techniques of photolithography, etching, deposition and chemical mechanical polishing. In some embodiments, multiple patterning techniques may be employed for the formation of the contact holes 1005 to 1012 filled with the electrically conductive material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor structure, comprising:
   a substrate comprising a semiconductor-on-insulator region and a bulk region;
   a first transistor located in said semiconductor-on-insulator region, said first transistor comprising a first gate structure and a first channel region provided in a layer of semiconductor material over a layer of electrically insulating material; and
   a second transistor located in said bulk region, said second transistor comprising a second gate structure and a second channel region provided in a bulk semiconductor material having an upper surface;
   wherein a plane containing said upper surface of said bulk semiconductor material located below said second gate structure in said bulk region is at a level that is at or below a level of a plane of an interface between said bulk semiconductor material and said layer of electrically insulating material in said semiconductor-on-insulator region; and
   wherein a top surface of said first gate structure and a top surface of said second gate structure are substantially coplanar, and wherein a height of said second gate structure is greater than a height of said first gate structure.

2. The semiconductor structure of claim 1, wherein each of said first gate structure and said second gate structure comprises a gate insulation layer comprising a high-k material having a greater dielectric constant than silicon dioxide and a gate electrode comprising a metal.

3. The semiconductor structure of claim 1, further comprising a third transistor located in said semiconductor-on-insulator region, said third transistor comprising a third gate structure and a third channel region provided in a portion of said layer of semiconductor material.

4. The semiconductor structure of claim 3, wherein said portion of said layer of semiconductor material comprising said third channel region has a smaller thickness than a portion of said layer of semiconductor material comprising said first channel region.

5. The semiconductor structure of claim 3, wherein each of said first transistor, said second transistor and said third transistor comprises a source region, a drain region, a raised source region over said source region and a raised drain region over said drain region, wherein said source and drain regions of said first transistor and said third transistor are provided in said layer of semiconductor material and said source and drain regions of said second transistor are provided in said bulk semiconductor material.

6. The semiconductor structure of claim 5, wherein one or more of said raised source regions, said raised drain regions and said gate structures of said first transistor, said second transistor and said third transistor comprise a silicide.

7. The semiconductor structure of claim 6, further comprising a layer of one or more dielectric materials over said first transistor, said second transistor and said third transistor and one or more contacts extending through said layer of one or more dielectric materials, each of said contacts providing an electrical connection to at least one of said raised source regions, said raised drain regions and said gate structures of said first transistor, said second transistor and said third transistor.

8. A method, comprising:
providing a substrate comprising a semiconductor-on-insulator region having a first semiconductor surface and a bulk region having a second semiconductor surface, wherein a plane of said second semiconductor surface is below a plane of said first semiconductor surface;
forming a first dummy gate structure above said first semiconductor surface and a second dummy gate structure above said second semiconductor surface;
depositing a dielectric layer over said first and second dummy gate structures;
performing a polishing process that planarizes said dielectric layer and said first and second dummy gate structures; and
performing a replacement gate process wherein a gate structure of a first transistor is formed on the basis of said first dummy gate structure and a gate structure of a second transistor is formed on the basis of said second dummy gate structure.

9. The method of claim 8, wherein said semiconductor-on-insulator region comprises a layer of an electrically insulating material positioned on a bulk semiconductor material and a layer of a semiconductor material positioned on said layer of electrically insulating material, said first semiconductor surface being a surface of said layer of semiconductor material;
wherein said bulk semiconductor material is exposed in said bulk region, said second semiconductor surface being a surface of said bulk semiconductor material; and
wherein said plane of said second semiconductor surface is not above a plane of an interface between said bulk semiconductor material and said layer of electrically insulating material in said semiconductor-on-insulator region.

10. The method of claim 9, wherein said providing of said substrate comprises:
providing a semiconductor-on-insulator wafer comprising a bulk semiconductor wafer, said layer of electrically insulating material over said bulk semiconductor wafer and said layer of semiconductor material over said layer of electrically insulating material; and
removing portions of said layer of semiconductor material and said layer of electrically insulating material from said bulk semiconductor region wherein a portion of said bulk semiconductor wafer is exposed, said second semiconductor surface being a surface of said exposed portion of said bulk semiconductor wafer.

11. The method of claim 8, further comprising:
after said replacement gate process, forming a first mask over said semiconductor-on-insulator region, wherein said first mask does not cover said bulk region;
after the formation of said first mask, performing a first etch process adapted to selectively remove said material of said dielectric layer, said first etch process removing a portion of said dielectric layer over said bulk region; and
after said first etch process, removing said first mask and performing a second etch process adapted to selectively remove said material of said dielectric layer, said second etch process removing a portion of said dielectric layer over said semiconductor-on-insulator region.

12. The method of claim 8, wherein an aspect ratio between a height of said first dummy gate structure and an extension of said first dummy gate structure in a channel length direction of said first transistor is about 2.5 or more.

13. The method of claim 12, wherein a height of said gate structure of said first transistor is less than about one half of said height of said first dummy gate structure.

14. The method of claim 13, wherein said height of said first dummy gate structure is in a range from about 70-90 nm, said height of said gate structure of said first transistor is in a range from about 20-30 nm and a step height between said plane of said first semiconductor surface and said plane of said second semiconductor surface is in a range from about 10-30 nm.

15. The method of claim 8, further comprising forming a third dummy gate structure on said first semiconductor surface, wherein said dielectric layer is deposited over said third dummy gate structure, said polishing process planarizes said third dummy gate structure, and said replacement gate process forms a gate structure of a third transistor on the basis of said third dummy gate structure.

16. The method of claim 15, wherein said formation of said first dummy gate structure, said second dummy gate structure and said third dummy gate structure comprises:
depositing a dummy gate stack over said substrate;
performing a common patterning process wherein said first dummy gate structure, said second dummy gate structure and said third dummy gate structure are formed by patterning said dummy gate stack; and
forming a sidewall spacer adjacent each of said first dummy gate structure, said second dummy gate structure and said third dummy gate structure.

17. The method of claim 16, further comprising, before said formation of said dielectric layer, performing a selective epitaxial growth process that deposits a semiconductor material adjacent said first dummy gate structure, said second dummy gate structure and said third dummy gate structure, wherein a respective raised source region and a respective raised drain region are formed adjacent each of said first dummy gate structure, said second dummy gate structure and said third dummy gate structure.

18. The method of claim 17, further comprising, after said second etch process, forming a silicide in one or more of said raised source and drain regions and said gate structures of said first, second and third transistors, forming a layer of one or more dielectric materials over said substrate, forming a plurality of contact holes in said layer of one or more dielectric materials and filling said plurality of contact holes with an electrically conductive material.

19. The method of claim 15, wherein said replacement gate process comprises removing each of said first dummy gate structure, said second dummy gate structure and said third dummy gate structure, wherein a first recess, a second recess and a third recess are formed, depositing a gate stack and removing portions of said gate stack outside said first recess, said second recess and said third recess.

20. The method of claim 19, further comprising, after said removal of each of said first dummy gate structure, said second dummy gate structure and said third dummy gate structure and before said deposition of said gate stack, forming a second mask, wherein said second mask covers said first recess and said second recess and does not cover said third recess, performing a third etch process that reduces a thickness of said portion of said layer of semiconductor material at a bottom of said third recess and, after said third etch process, removing said second mask.

* * * * *